US012609708B2

(12) United States Patent　　　　　(10) Patent No.:　US 12,609,708 B2

Kotzer　　　　　　　　　　　　　　(45) Date of Patent:　　　Apr. 21, 2026

(54) SYSTEM AND METHOD FOR MEASURING RADIO FREQUENCY PHASE SHIFT OF AN INLINE DEVICE

(71) Applicant: GM Global Technology Operations LLC, Detroit, MI (US)

(72) Inventor: Igal Kotzer, Tel Aviv (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 18/910,134

(22) Filed: Oct. 9, 2024

(65) Prior Publication Data

US 2026/0100714 A1　　Apr. 9, 2026

(51) Int. Cl.
　　*H03L 7/093*　　　　(2006.01)
(52) U.S. Cl.
　　CPC ..................................... *H03L 7/093* (2013.01)
(58) Field of Classification Search
　　CPC ........................................................ H03L 7/093
　　USPC ............................................................ 331/44
　　See application file for complete search history.

(56) References Cited

U.S. PATENT DOCUMENTS

| | | | |
|---|---|---|---|
| 4,988,957 A | 1/1991 | Thompson et al. | |
| 2011/0299644 A1* | 12/2011 | Xu ........................... H03L 7/093 | |
| | | | 375/376 |
| 2012/0308227 A1 | 12/2012 | Komaki et al. | |
| 2013/0314168 A1* | 11/2013 | Sinoussi ................. H03L 1/022 | |
| | | | 331/167 |
| 2017/0025998 A1* | 1/2017 | Chen ......................... G01J 5/44 | |

OTHER PUBLICATIONS

German Office Action for German Application No. 102024135099.7; dated Jun. 5, 2025; 6 pages.

* cited by examiner

*Primary Examiner* — Joseph Chang

(74) *Attorney, Agent, or Firm* — CANTOR COLBURN LLP

(57)　　　　　　　　ABSTRACT

A testing device includes an oscillator circuit with an inline device. The oscillator circuit includes a loop having a variable gain amplifier and a variable feedback block. The inline device is installed between the variable gain amplifier and the variable feedback block. An output of the variable feedback block is input to the variable gain amplifier. A processor varies a phase of the variable feedback block to locate a block phase shift of the variable feedback block at which the oscillator circuit generates an output signal, determines a device phase shift of the inline device from the block phase shift, and adjusts an operation of a driven circuit operating off of the output of the oscillator circuit using the device phase shift of the inline device.

20 Claims, 4 Drawing Sheets

500

502

504

506

508

SYSTEM AND METHOD FOR MEASURING RADIO FREQUENCY PHASE SHIFT OF AN INLINE DEVICE

The subject disclosure relates to inline devices and, in particular, to a system and method for measuring phase shift for an inline device and compensating for the phase shift introduced by the inline device.

Various electronic devices, such as beamforming devices, require a precise phase relation to operate properly. An extra phase shift can be introduced to the signal path by repeated installation of devices, changes in temperature, various mechanical conditions, etc., all of which need to be accounted for in order to maintain a desired phase relation. Accordingly, it is desirable to provide a system and method for measuring a phase shift resulting from insertion of an inline device and to compensate for the phase shift.

SUMMARY

In one exemplary embodiment, a method for determining a phase shift of an inline device is disclosed. The inline device is installed in an oscillator circuit that includes a loop having a variable gain amplifier and a variable feedback block. The inline device is installed between the variable gain amplifier and the variable feedback block. An output of the variable feedback block is input to the variable gain amplifier. A phase of the variable feedback block is varied to locate a block phase shift of the variable feedback block at which the oscillator circuit generates an output signal. A device phase shift of the inline device is determined from the block phase shift. An operation of a driven device operating off of the output of the oscillator circuit is adjusted using the device phase shift of the inline device.

In addition to one or more of the features described herein, locating the block phase shift further includes varying the phase of the variable feedback block and a gain of the amplifier until the loop meets a Barkhausen phase condition.

In addition to one or more of the features described herein, the method further includes determining a first block phase shift of the variable feedback block that satisfies the Barkhausen phase condition without the inline device, introducing the inline device in the loop, determining a second block phase shift that satisfies the Barkhausen phase condition for the loop with the inline device, and determining the device phase shift of the inline device from a difference of the first block phase shift and the second block phase shift.

In addition to one or more of the features described herein, wherein the variable feedback block includes an adjustable phase shifter, the method further includes varying the phase of the adjustable phase shifter to locate the block phase shift.

In addition to one or more of the features described herein, the adjustable phase shifter is one of a mechanically adjustable phase shifter, an electrically adjustable phase shifter, a varicap diode, and a time delay device.

In addition to one or more of the features described herein, the method further includes raising a gain of the variable gain amplifier to operate the oscillator circuit in a saturated state to produce a square wave and adjusting the phase of the variable feedback block to locate the block phase shift with the oscillator circuit in the saturated state.

In addition to one or more of the features described herein, the method further includes using the output of the oscillator circuit in at least one of a beamforming circuit, a radar circuit, and a cellular network.

In another exemplary embodiment, an oscillator circuit is disclosed. The oscillator includes a variable gain amplifier, a variable feedback block, an inline device, and a processor. The inline device is installed between the variable gain amplifier and the variable feedback block to form a loop. An output of the variable feedback block is input to the variable gain amplifier. The processor is configured to vary a phase of the variable feedback block to locate a block phase shift of the variable feedback block at which the oscillator circuit generates an output signal, determine a device phase shift of the inline device from the block phase shift, and adjust an operation of a driven circuit operating off of the output of the oscillator circuit using the device phase shift of the inline device.

In addition to one or more of the features described herein, the processor is further configured to locate the block phase shift by varying the phase of the variable feedback block until the loop meets a Barkhausen phase condition.

In addition to one or more of the features described herein, the processor is further configured to determine a first block phase shift of the variable feedback block that satisfies the Barkhausen phase condition without the inline device, determine a second block phase shift that satisfies the Barkhausen phase condition for the loop with the inline device inserted in the loop, and determine the device phase shift of the inline device from a difference of the first block phase shift and the second block phase shift.

In addition to one or more of the features described herein, wherein the variable feedback block includes an adjustable phase shifter, the processor is further configured to vary the phase of the adjustable phase shifter to locate the block phase shift.

In addition to one or more of the features described herein, the adjustable phase shifter is one of a mechanically adjustable phase shifter, an electrically adjustable phase shifter, a varicap diode, and a time delay device.

In addition to one or more of the features described herein, the processor is further configured to raise a gain of the variable gain amplifier to operate the oscillator circuit in a saturated state to produce a square wave and adjust the phase of the variable feedback block to locate the block phase shift with the oscillator circuit in the saturated state.

In addition to one or more of the features described herein, the output is sent to at least one of a beamforming circuit, a radar circuit, and a cellular network.

In another exemplary embodiment, a testing device is disclosed. The testing device includes an oscillator circuit and a processor. The oscillator circuit includes a variable gain amplifier, and a variable feedback block, wherein an inline device is installable between the variable gain amplifier and the variable feedback block to form a loop and an output of the variable feedback block is input to the variable gain amplifier. The processor is configured to vary a phase of the variable feedback block to locate a block phase shift of the variable feedback block at which the oscillator circuit generates an output signal, determine a device phase shift of the inline device from the block phase shift, and adjust an operation of a driven circuit operating off of the output of the oscillator circuit using the device phase shift of the inline device.

In addition to one or more of the features described herein, the processor is further configured to locate the block phase shift by varying the phase of the variable feedback block until the loop meets a Barkhausen phase condition.

In addition to one or more of the features described herein, the processor is further configured to determine a first block phase shift of the variable feedback block that satisfies the Barkhausen phase condition without the inline device, determine a second block phase shift that satisfies the Barkhausen phase condition for the loop with the inline device inserted in the loop, and determine the device phase shift of the inline device from a difference of the first block phase shift and the second block phase shift.

In addition to one or more of the features described herein, wherein the variable feedback block includes an adjustable phase shifter, the processor is further configured to vary the phase of the adjustable phase shifter to locate the block phase shift.

In addition to one or more of the features described herein, the adjustable phase shifter is one of a mechanically adjustable phase shifter an electrically adjustable phase shifter, a varicap diode, and a time delay device.

In addition to one or more of the features described herein, the processor is further configured to raise a gain of the variable gain amplifier to operate the oscillator circuit in a saturated state to produce a square wave and adjust the phase of the variable feedback block to locate the block phase shift with the oscillator circuit in the saturated state.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 2:
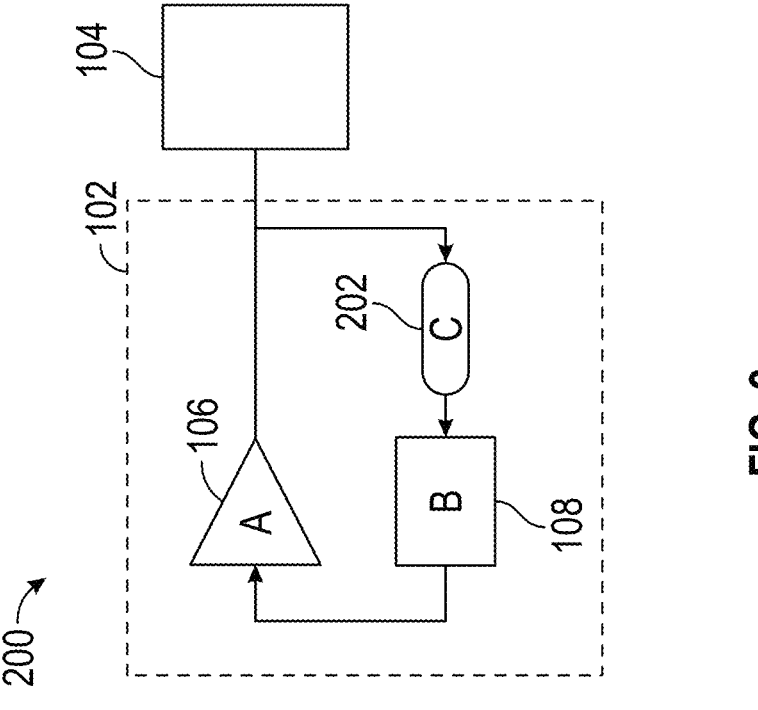
FIG. 2 shows a diagram of the oscillator circuit in an alternate embodiment.

The following description is merely exemplary in nature and is not intended to limit the present disclosure, its application or uses. It should be understood that throughout the drawings, corresponding reference numerals indicate like or corresponding parts and features.

Figure 1:
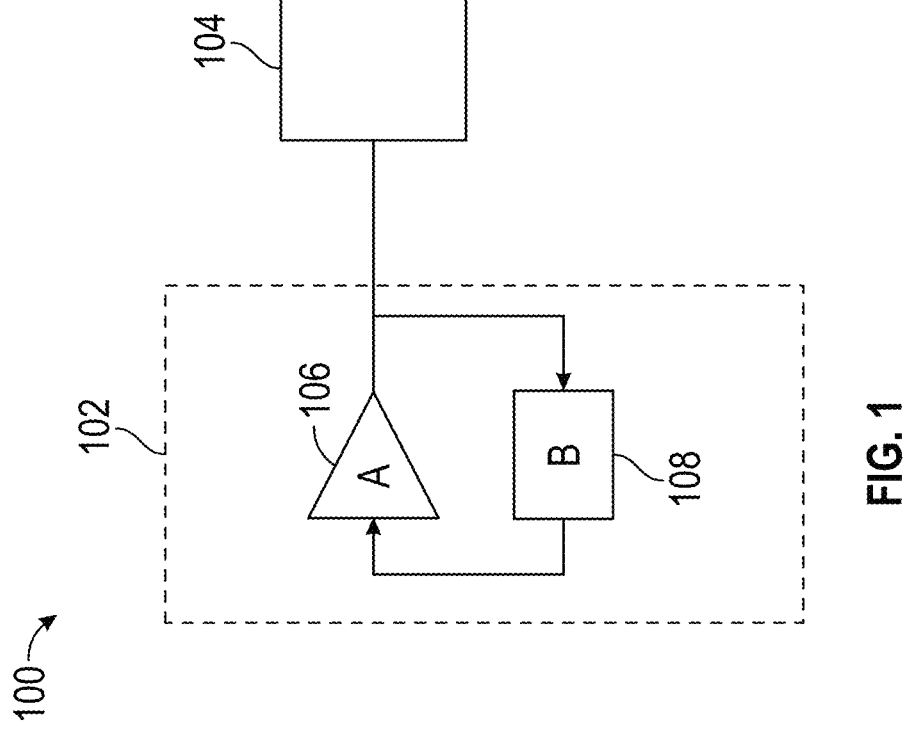
FIG. 1 shows an electrical circuit in accordance with an exemplary embodiment.

In accordance with an exemplary embodiment, FIG. 1 shows an electrical circuit 100. The electrical circuit 100 includes an oscillator circuit 102 and a driven device or driven circuit 104. An output of the oscillator circuit 102 is provided to the driven circuit 104. The driven circuit 104 can be a beamforming circuit, a radar circuit, a cellular network or other suitable electric device operatable off of an oscillator signal input.

The oscillator circuit 102 includes an amplifier 106 (such as an operational amplifier) and a feedback network 108. The amplifier 106 is labelled A and the feedback network 108 is labelled B. The output of the amplifier 106 is fed into the input of the feedback network 108 and the output of the feedback network is fed into the input of the amplifier.

For an oscillation to occur, a feedback circuit must satisfy Barkhausen conditions at a certain frequency. The Barkhausen conditions include: 1) that the overall loop gain is unity, and 2) the overall loop phase shift is a multiple of

4

360 degrees ($2\pi$). The first Barkausen condition (Barkausen gain condition) is as shown in (Eq. (1)):

$$|A|*|B|=1 \qquad \text{Eq. (1)}$$

where |A| is the magnitude of the amplifier gain and |B| is the magnitude of the feedback network gain. The second Barkhausen condition (Barkausen phase condition) is as shown in Eq. (2):

$$ang(A)+ang(B)=k*21 \qquad \text{Eq. (2)}$$

where ang(A) is the phase of the amplifier, ang(B) is the phase of the feedback network, and k is an integer. In general, the amplifier gain |A| is a constant value and the amplifier phase shift ang(A) is a constant value. Similarly, the feedback network gain |B| is a constant value and the feedback network phase shift ang(B) is a constant value.

FIG. 2 shows a diagram 200 of the oscillator circuit 102 in an alternate embodiment. The oscillator circuit 102 includes the amplifier 106, the feedback network 108 and an inline device 202. The inline device 202 can be a wire, a filter, a transmission line, or other suitable device. The output of the amplifier 106 is fed into the inline device 202. The output of the inline device 202 is fed into the feedback network 108 and the output of the feedback network is fed into the input of the amplifier 106.

The inclusion of the inline device 202 in the loop changes both the gain and the phase of the loop. The Barkhausen conditions are for the oscillator circuit 102 of FIG. 2 is shown in Eqs. (3) and (4):

$$|A|*|B|*|C|=1 \qquad \text{Eq. (3)}$$

where |C| is the magnitude of the inline device.

$$ang(A)+ang(B)+ang(C)=k*21 \qquad \text{Eq. (4)}$$

where ang(C) is the phase of the inline device. By compensating for the change in gain and phase caused by introducing the inline device 202 into the loop, it is possible to determine the additional device phase shift introduced by the inline device.

Figure 3:
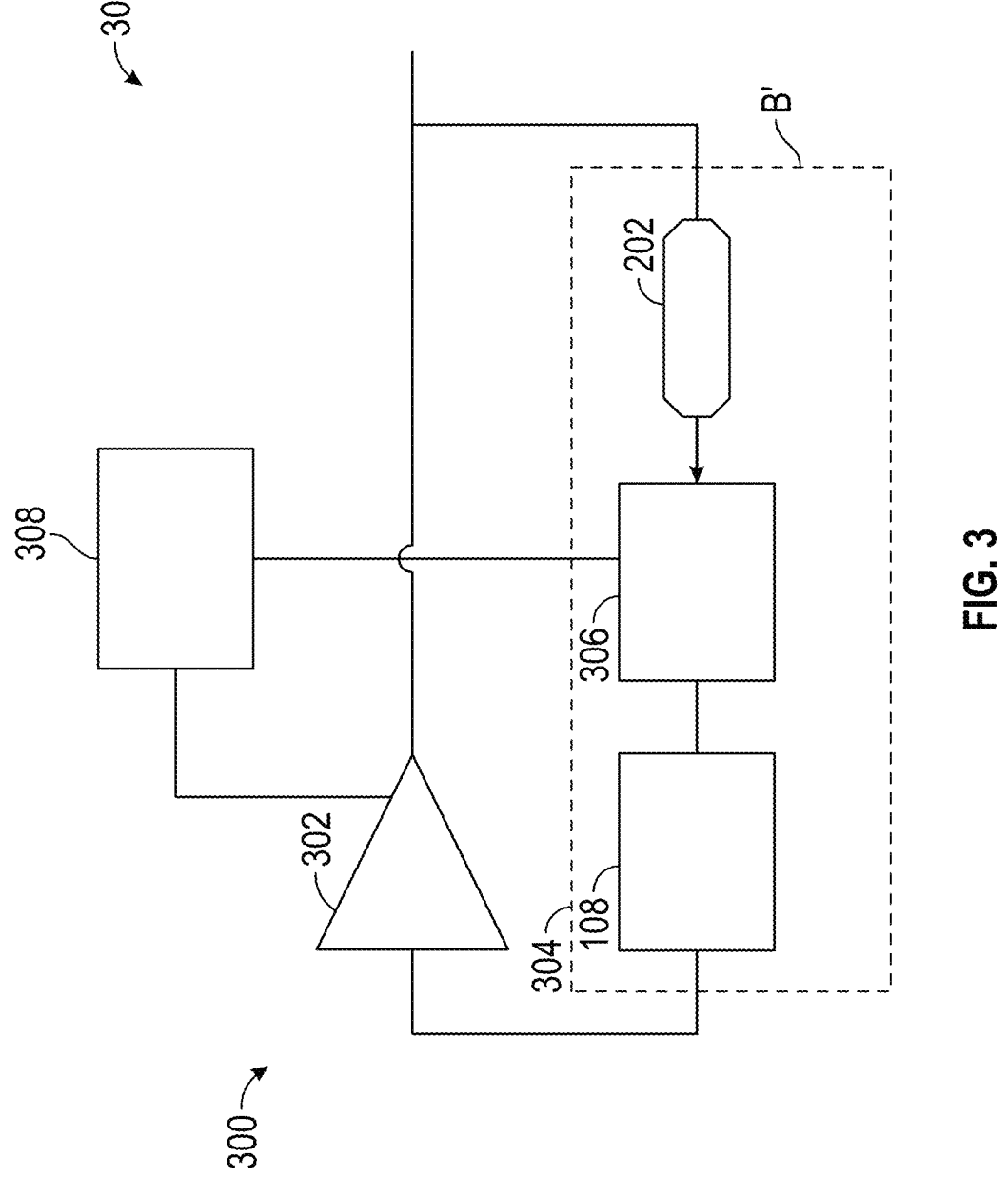
FIG. 3 shows a modified oscillator circuit in an illustrative embodiment.

FIG. 3 shows a modified oscillator circuit 300 in an illustrative embodiment. The modified oscillator circuit 300 can be used as part of a testing device for testing a device phase shift introduced by an inline device. The modified oscillator circuit 300 includes a variable gain amplifier 302 and a variable feedback block 304. The variable feedback block 304 is indicated by B' and includes the feedback network 108, the inline device 202 and an adjustable phase shifter 306.

A controller 308 controls an operation of the variable gain amplifier 302 and the adjustable phase shifter 306. The controller 308 may include processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The controller 308 may include a non-transitory computer-readable medium that stores instructions which, when processed by one or more processors of the controller 308, implement a method of determining a device phase shift of the inline device 202, according to one or more embodiments detailed herein.

The gain |A| of the variable gain amplifier 302 can be raised or lowered. Both the gain and the phase shift of the adjustable phase shifter 306 can be adjusted. As a non-limiting set of examples, the adjustable phase shifter 306 can be a mechanically adjustable phase shifter, an electrically adjustable phase shifter (e.g., or a mechanical phase shifter that is adjusted by an electrical motor), a varicap diode or a device based on one or more varicap diodes, a time delay device or a device with multiple time delay sections, etc. In an embodiment, the output of the inline device 202 is fed to the adjustable phase shifter 306. The feedback network 108 and the adjustable phase shifter 306 are wired in series.

Since the device phase shift of the inline device 202 is most likely not to be zero (i.e., ang(C)≠0), the adjustable phase shifter 306 can be operated to make the loop of FIG. 3 meet the Barkhausen phase condition. Once a block phase shift (ang(B)) for the variable feedback block 304 (and gain of variable gain amplifier 302) is found that satisfies the Barkhausen phase condition, namely ang(A)+ang(B')=k*2π, it is possible to extract ang(C) (i.e., the device phase shift introduced by the inline device 202). This is shown by Eq. (4):

$$ang(C)=ang(B')-ang(B) \qquad \text{Eq. (4)}$$

In order to determine the Barkhausen conditions, gain and phase of the loop need to be adjusted until the conditions are met. This is equivalent to searching again/phase space of the loop circuit.

The device phase shift of the inline device can be determined using separate measurements. A first block phase shift of the variable feedback block is determined that satisfies the Barkhausen phase condition without the inline device 202 in the loop. The inline device 202 is then introduced into the loop. A second block phase shift of the variable feedback block is determined that satisfies the Barkhausen phase condition for the loop including the inline device 202. The gain of the variable feedback block can be adjusted prior to determining the second phase shift. The device phase shift of the inline device 202 is determined from a difference of the first block phase shift and the second block phase shift.

Figure 4:
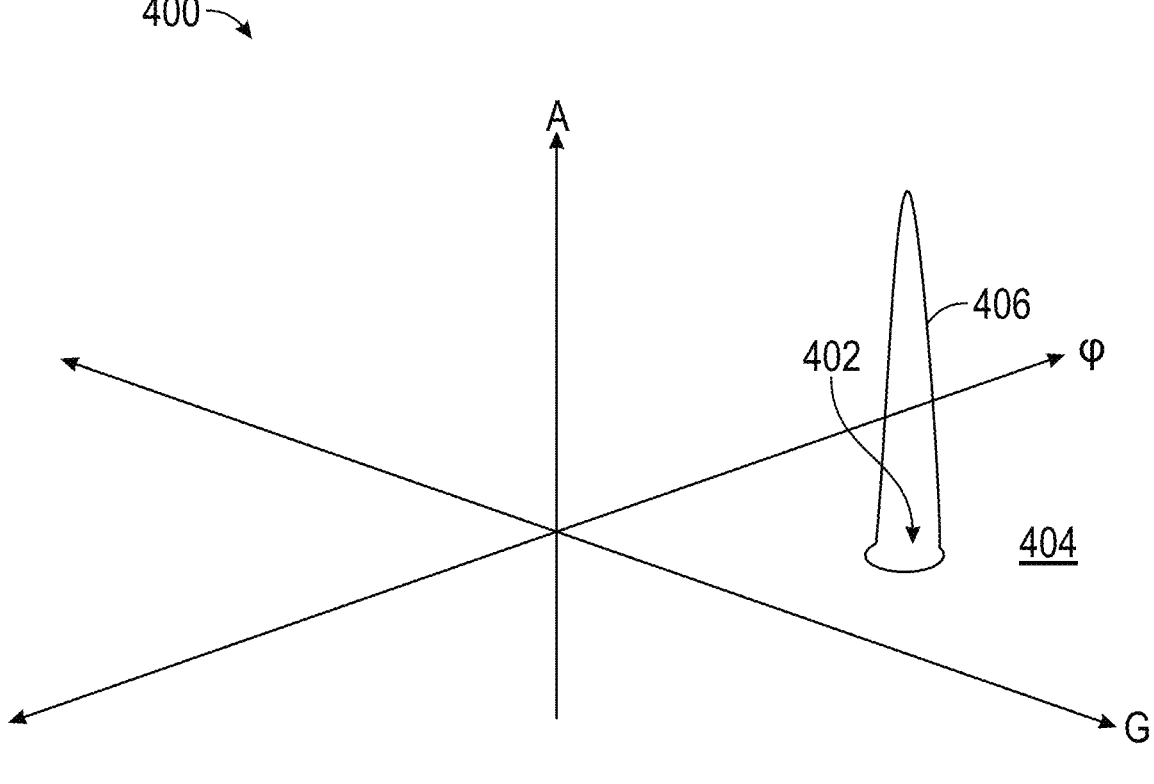
FIG. 4 shows a gain/phase space for a loop.

FIG. 4 shows a gain/phase space 400 for a loop. A gain axis (G) and a phase axis (φ) are shown. An amplitude axis (A) indicates a strength of oscillation signals and/or whether the oscillations decay or explode. A first region 402 is defined in the space where the gain and phase satisfy the Barkhausen conditions. A second region 404 is defined where the gain and phase do not satisfy the Barkhausen conditions. Oscillations are present in the modified oscillator circuit 300 when the loop satisfies both Barkhausen conditions but are generally not present when either of these conditions are not met. A boundary 406 between the first region 402 and the second region 404 is sharp. Thus, when search the gain/phase space, oscillations appear rapidly (as shown by the extension of the boundary along the amplitude axis when Barkhausen conditions are met (i.e., in the first region 402) and quickly disappear when the conditions are not met (i.e., in the second region 404).

The adjustable phase shifter 306 generally has an insertion loss that results in a gain relation between the input signal and the output signal. This insertion loss can be independently measured and stored. When the adjustable phase shifter 306 is added to the loop, the stored data can be pulled and used as an initial value when performing the search of the gain of the loop.

The insertion loss of the inline device 202 is generally unknown. Thus, when the inline device 202 is introduced into the loop, a search algorithm can be performed to determine a value of the gain |A| of the variable gain amplifier 302 that compensates for the insertion loss of the inline device 202 so that the loop meets Barkhausen gain condition.

While a two-dimensional search of the gain/phase space can be performed to locate the Barkhausen conditions, due to the sharpness of the boundary 406 between the first region 402 and the second region 404, such two-dimensional search can be a time-consuming process. It is therefore desirable to search the gain/phase space in a manner that can be completed in a reduced amount of time.

Figure 5:
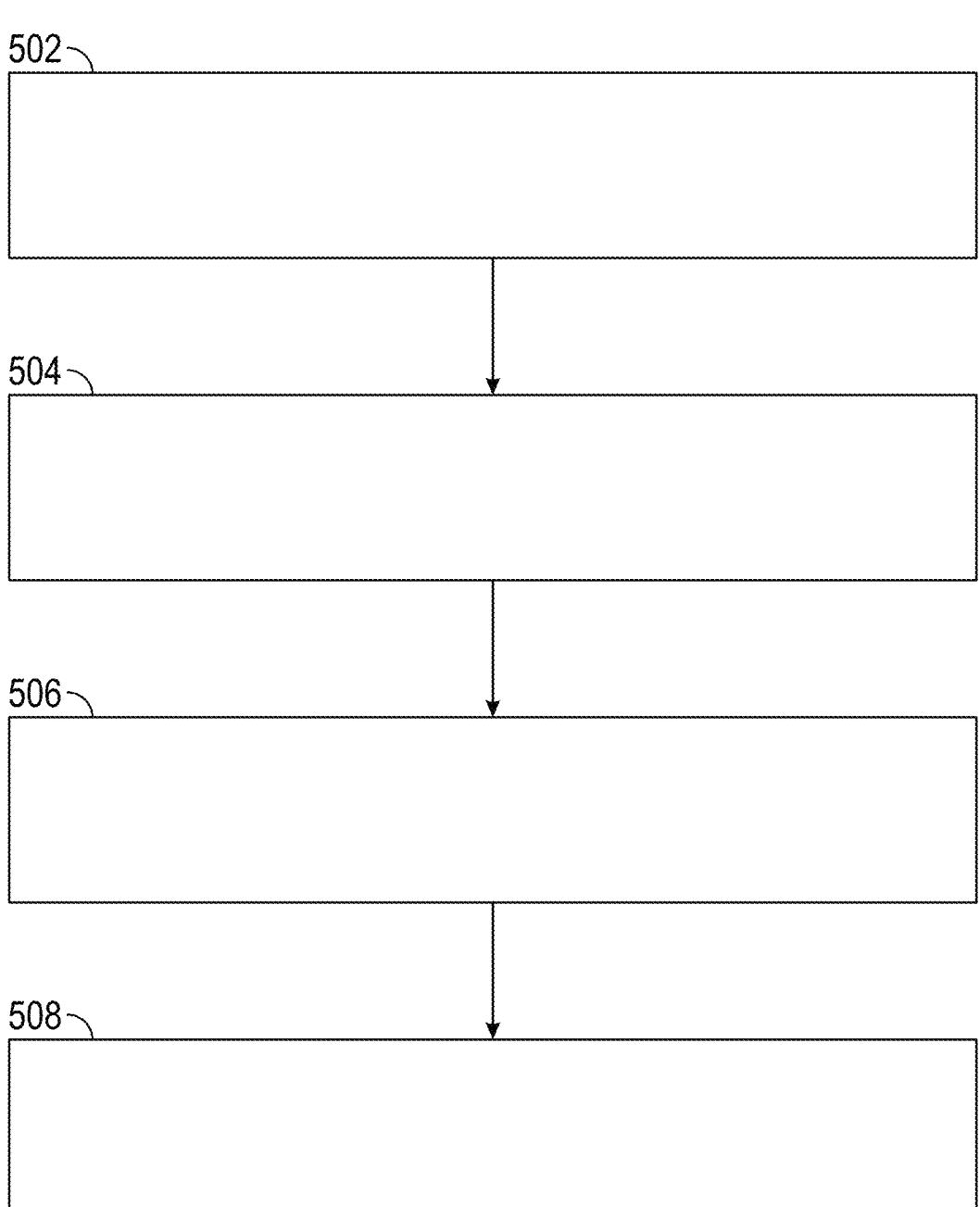
FIG. 5 shows a flowchart of a method for searching the gain/phase space by searching only the phase parameter.

FIG. 5 shows a flowchart 500 of a method for searching the gain/phase space by searching only the phase parameter. In box 502, the inline device is inserted into the oscillator circuit, which includes a variable gain amplifier 302 and an adjustable phase shifter 306. In box 504, the gain of the variable gain amplifier 302 is raised to a value that produces saturation of the oscillator circuit. In this saturated state, the variable gain amplifier 302 produces square waves rather than sine waves. Since the square wave includes multiple harmonic frequencies (more than just a fundamental frequency), the search can be performed by varying only the phase parameter. In box 506, a one-dimensional search of the phase parameter can be performed to locate a phase that satisfies the Barkhausen condition for the loop. This one-dimensional search can be performed in a reduced amount of time in comparison to a two-dimensional search of the gain/phase space. In box 508, the gain of the adjustable phase shifter is determined that causes the loop to meet the Barkhausen gain condition for the located phase.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method for determining a phase shift of an inline device, comprising:

determining a first block phase shift of an oscillator circuit that allows the oscillator circuit to satisfy a Barkhausen phase condition, the oscillator circuit including a loop having a variable gain amplifier, an adjustable phase shifter and a feedback network, wherein an output of the variable gain amplifier is input to the adjustable phase shifter and the output of the feedback network is input to the variable gain amplifier;

inserting a transmission line into the loop between the output of the variable gain amplifier and the input to the adjustable phase shifter;

varying a phase of the oscillator circuit to locate a second block phase shift of the oscillator circuit at which the oscillator circuit generates an output signal;

determining a device phase shift of the transmission line from a difference of the first block phase shift and the second block phase shift; and adjusting an operation of a driven device operating off of the output of the oscillator circuit using the device phase shift of the transmission line.

2. The method of claim 1, wherein locating the second block phase shift further comprises varying the phase of the oscillator circuit and a gain of the oscillator circuit until the loop meets a Barkhausen phase condition.

3. The method of claim 1, further comprising varying the phase of the adjustable phase shifter to vary the phase of the oscillator circuit.

4. The method of claim 3, wherein the adjustable phase shifter is one of: (i) a mechanically adjustable phase shifter; (ii) an electrically adjustable phase shifter; (iii) a varicap diode; and (iv) a time delay device.

5. The method of claim 1, further comprising raising a gain of the variable gain amplifier to operate the oscillator circuit in a saturated state to produce a square wave and adjusting the phase of the oscillator circuit to locate the second block phase shift with the oscillator circuit in the saturated state.

6. The method of claim 5, further comprising using an independent value of the device phase shift of the transmission line as an initial value for determining the second block phase shift.

7. The method of claim 1, further comprising using the output of the oscillator circuit in at least one of: (i) a beamforming circuit; (ii) a radar circuit; and (iii) a cellular network.

8. An oscillator circuit, comprising:

a loop comprising a variable gain amplifier, a feedback network and an adjustable phase shifter, wherein an output of the variable gain amplifier is input to the adjustable phase shifter and the output of the feedback network is input to the variable gain amplifier, wherein a transmission line is insertable into the loop between the output of the variable gain amplifier and the input to the adjustable phase shifter;

a processor configured to:

determine a first block phase shift of the oscillator circuit that allows the oscillator circuit to satisfy a Barkhausen phase condition without the transmission line;

vary a phase of the oscillator circuit to locate a second block phase shift of the oscillator circuit at which the oscillator circuit generates an output signal with the transmission line inserted;

determine a device phase shift of the transmission line from a difference of the first block phase shift and the second block phase shift; and adjust an operation of a driven circuit operating off of the output of the oscillator circuit using the device phase shift of the transmission line.

9. The oscillator circuit of claim 8, wherein the processor is further configured to locate the second block phase shift by varying the phase of the oscillator circuit and a gain of the oscillator circuit until the loop meets a Barkhausen phase condition.

10. The oscillator circuit of claim 8, wherein the processor is further configured to vary the phase of the adjustable phase shifter to vary the phase of the oscillator circuit.

11. The oscillator circuit of claim 10, wherein the adjustable phase shifter is one of: (i) a mechanically adjustable phase shifter; (ii) an electrically adjustable phase shifter; (iii) a varicap diode; and (iv) a time delay device.

12. The oscillator circuit of claim 8, wherein the processor is further configured to raise a gain of the variable gain amplifier to operate the oscillator circuit in a saturated state to produce a square wave and adjust the phase of the oscillator circuit to locate the second block phase shift with the oscillator circuit in the saturated state.

13. The oscillator circuit of claim 12, wherein the processor is further configured to use an independent value of the device phase shift of the transmission line as an initial value for determining the second block phase shift.

14. The oscillator circuit of claim 8, wherein the output is sent to at least one of: (i) a beamforming circuit; (ii) a radar circuit; and (iii) a cellular network.

15. A testing device, comprising:

an oscillator circuit comprising:

a loop comprising a variable gain amplifier, a feedback network and an adjustable phase shifter, wherein an output of the variable gain amplifier is input to the adjustable phase shifter and the output of the feedback network is input to the variable gain amplifier, wherein a transmission line is insertable into the loop between the output of the variable gain amplifier and the input to the adjustable phase shifter; and a processor configured to:

determine a first block phase shift of the oscillator circuit that allows the oscillator circuit to satisfy a Barkhausen phase condition without the transmission line;

vary a phase of the oscillator circuit to locate a second block phase shift of the oscillator circuit at which the oscillator circuit generates an output signal with the transmission line inserted;

determine a device phase shift of the transmission line from a difference of the first block phase shift and the second block phase shift; and adjust an operation of a driven circuit operating off of the output of the oscillator circuit using the device phase shift of the transmission line.

16. The testing device of claim 15, wherein the processor is further configured to locate the second block phase shift by varying the phase of the oscillator circuit and a gain of the oscillator circuit until the loop meets a Barkhausen phase condition.

17. The testing device of claim 15, wherein the processor is further configured to vary the phase of the adjustable phase shifter to vary the phase of the oscillation circuit.

18. The testing device of claim 17, wherein the adjustable phase shifter is one of: (i) a mechanically adjustable phase shifter; (ii) an electrically adjustable phase shifter; (iii) a varicap diode; and (iv) a time delay device.

19. The testing device of claim 15, wherein the processor is further configured to raise a gain of the variable gain amplifier to operate the oscillator circuit in a saturated state to produce a square wave and adjust the phase of the oscillator circuit to locate the second block phase shift with the oscillator circuit in the saturated state.

20. The testing device of claim 19, further comprising using an independent value of the device phase shift of an inline device as an initial value for determining the second block phase shift.

* * * * *